United States Patent

Glass et al.

[11] Patent Number: 5,821,785
[45] Date of Patent: Oct. 13, 1998

[54] CLOCK SIGNAL FREQUENCY MULTIPLIER

[75] Inventors: Kevin W. Glass, Scottsdale, Ariz.; Mehrdad Heshami, Palo Alto, Calif.

[73] Assignee: Rockwell Int'l Corp., Newport Beach, Calif.

[21] Appl. No.: 691,765

[22] Filed: Aug. 2, 1996

[51] Int. Cl.⁶ .................................................. H03B 19/00
[52] U.S. Cl. .......................................... 327/116; 327/107
[58] Field of Search ................................. 327/116, 119, 327/122, 149, 150, 152, 153, 155, 158, 159, 161, 234, 243, 244, 105, 107; 377/47, 48

[56] References Cited

U.S. PATENT DOCUMENTS

| 5,192,916 | 3/1993 | Glass | 327/157 |
| 5,220,206 | 6/1993 | Tsang et al. | 327/544 |
| 5,359,232 | 10/1994 | Eitrheim et al. | 327/116 |
| 5,548,235 | 8/1996 | Marbot | 327/116 |
| 5,614,841 | 3/1997 | Marbot et al. | 327/116 |

FOREIGN PATENT DOCUMENTS

| 0441684 | 8/1991 | European Pat. Off. . |
| 0477582 | 4/1992 | European Pat. Off. . |
| 0609967 | 8/1994 | European Pat. Off. . |

*Primary Examiner*—My-Trang Nu Ton
*Attorney, Agent, or Firm*—James P. O'Shaughnessy; Susie H. Oh

[57] ABSTRACT

The invention relates to a clock signal frequency multiplier circuit. The circuit multiplies the speed of a clock signal of an integrated circuit (IC) by a factor N to generate a times-N clock signal. The circuit first receives a clock signal. Next, the circuit replicates the clock signal into a plurality of N component signals. Each Jth component signal is delayed from the (J–1)th component signal by 1/N cycles, where J equals 1 to N. The (J=1)th component signal is the clock signal. The N component signals are referred to as phase-shifted components. Finally, the circuit logically combines the phase-shifted components into a times-N clock signal.

6 Claims, 6 Drawing Sheets

CLOCK SIGNAL FREQUENCY MULTIPLIER

1. BACKGROUND OF THE INVENTION

This invention relates in general to integrated circuits. More particularly this invention relates to a power and area efficient clock signal multiplier.

2. SUMMARY OF THE INVENTION

The invention relates to a clock signal frequency multiplier circuit. The circuit multiplies the speed of a clock signal of an integrated circuit (IC) by a factor N to generate a times-N clock signal. The circuit first receives a clock signal. Next, the circuit replicates the clock signal into a plurality of N component signals. Each Jth component signal is delayed from the (J−1)th component signal by 1/N cycles, where J equals 1 to N. The (J=1)th component signal is the clock signal. The N component signals are referred to as phase-shifted components. Finally, the circuit logically combines the phase-shifted components into a times-N clock signal. With appropriate circuitry, software may be used to make the multiplier software-selectable (e.g., 2×, 3× . . . ).

One embodiment of the clock frequency multiplier includes an two edge detectors, a set-reset latch, a voltage control delay line (VCDL) circuit with a plurality of component signals, a phase-and-frequency detector, a low pass filter, a circuit that logically combines the plurality of taps to form a high frequency clock circuit.

The first edge detector receives a clock-in signal. The clock-in signal is the clock signal that is to be multiplied. The output of the edge detector sets the set-reset latch. The output of the set-reset latch, referred to as the latched output, is delayed by the VCDL. The VCDL is controlled so that the latched output is delayed by half a cycle, ie., its phase is shifted by 180 degrees. The half-cycle-delayed output is fed into the second edge detector. The output of this second edge detector resets the set-reset latch. The latched output and the half-cycle-delayed output are fed into the phase-and-frequency detector which generates a phase error signal. The phase error signal is integrated by a low pass filter and the resulting integrated phase error signal controls the delay of the VCDL. Finally, the plurality of VCDL component signals are logically combined to generate a high speed clock signal.

3. BRIEF DESCRIPTION OF THE DRAWINGS

Figure 1:
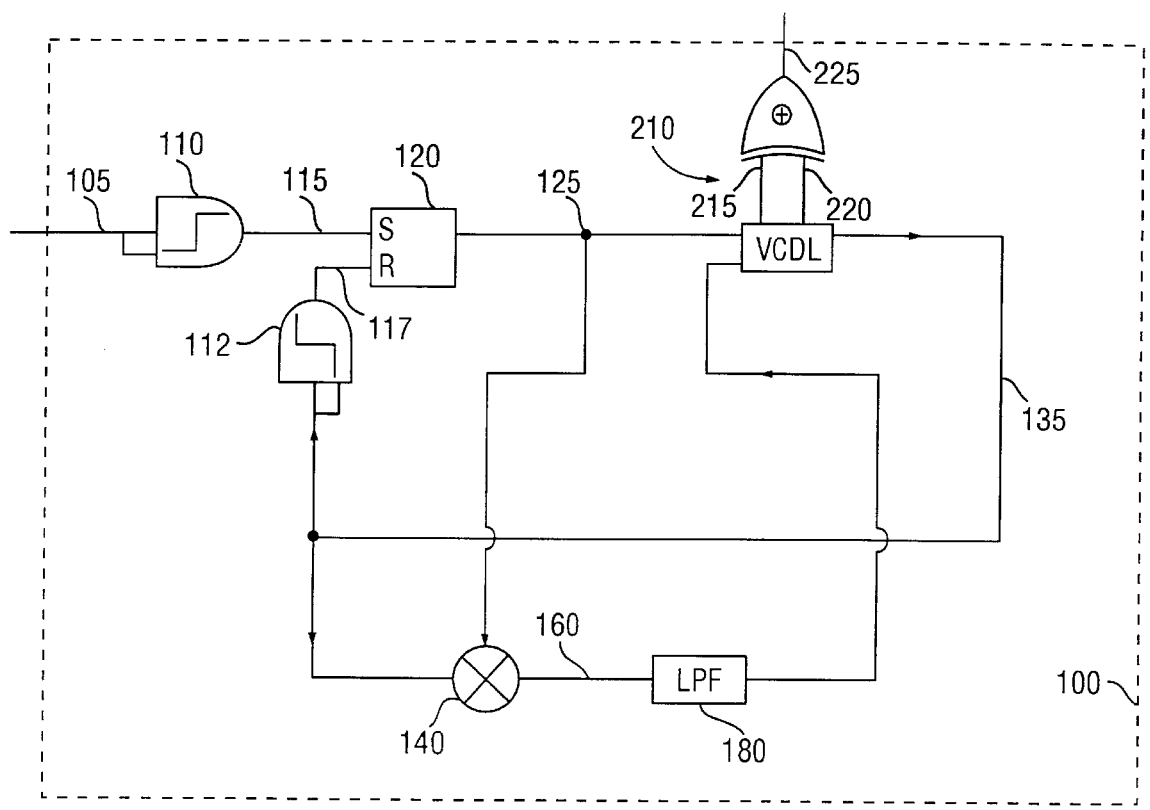
FIG. 1 is a circuit diagram of an embodiment of a clock signal frequency multiplier.

4. DETAILED DESCRIPTION OF SPECIFIC EMBODIMENTS 4.1 First Edge Detector and Set-Reset Latch Referring to FIG. 1, the clock signal multiplier 100 is configured to receive a clock-in signal 105. This clock-in signal 105 could be a computer system clock, a computer bus clock or any periodic logic signal such as from a crystal oscillator. The clock-in signal 105 is first fed into a conventional edge detector 110.

Figure 2:
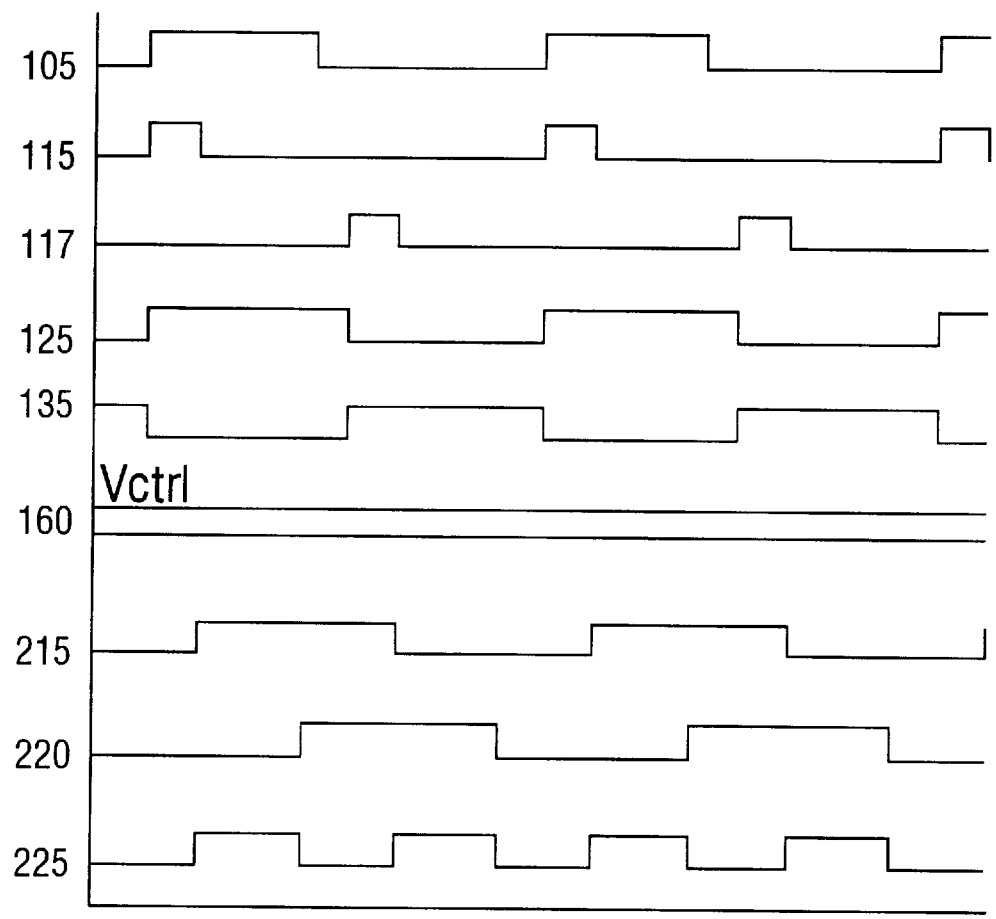
FIG. 2 is a timing diagram of various signals of the clock signal frequency multiplier of FIG. 1.

As shown in FIG. 2, the edge detector output 115 is TRUE each time the edge detector 110 receives a clock-in signal 105. Referring again to FIG. 1, the output 115 of the edge detector 110 is fed to a conventional set-reset latch 120 as a SET signal. Again, as shown in FIG. 2, the output of the set-reset latch 120, referred to as the latched output 125, is TRUE every time the output 115 of the edge detector 110 is TRUE.

4.2. The Voltage Control Delay Line

Referring again to FIG. 1, the latched output 125 may be delayed by a conventional voltage control delay line, referred to as a VCDL 130. Alternatively, a VCDL 130 may be constructed from pairs of delay elements separated by a buffer or an inverter. Such a VCDL 130 may improve the rise and fall time of the delay line tap. By matching the delay of the intermediate VCDL buffers to the delay of the final VCDL buffer plus the delay of the second edge detector 112 and the delay of the reset time of the set-reset latch 120, a more precise high speed clock signal 225 may be obtained.

The VCDL 130 is controlled, as discussed below, so that the latched output 125 is delayed by half a cycle, i.e., its phase is shifted by 180 degrees. The half-cycle-delayed output 135 is fed to the second edge detector 112. The output 117 of the second edge detector 112 is fed to the set-reset latch 120 as a RESET signal.

4.3 Phase-and-Frequency Detector

Referring again to FIG. 1, the latched output 125 and the half-cycle-delayed output 135 are fed into a phase-and-frequency detector 140. This phase-and-frequency detector 140 detects the differences in both phase and frequency between the latched output 125 and the half-cycle-delayed output 135.

Figure 3:
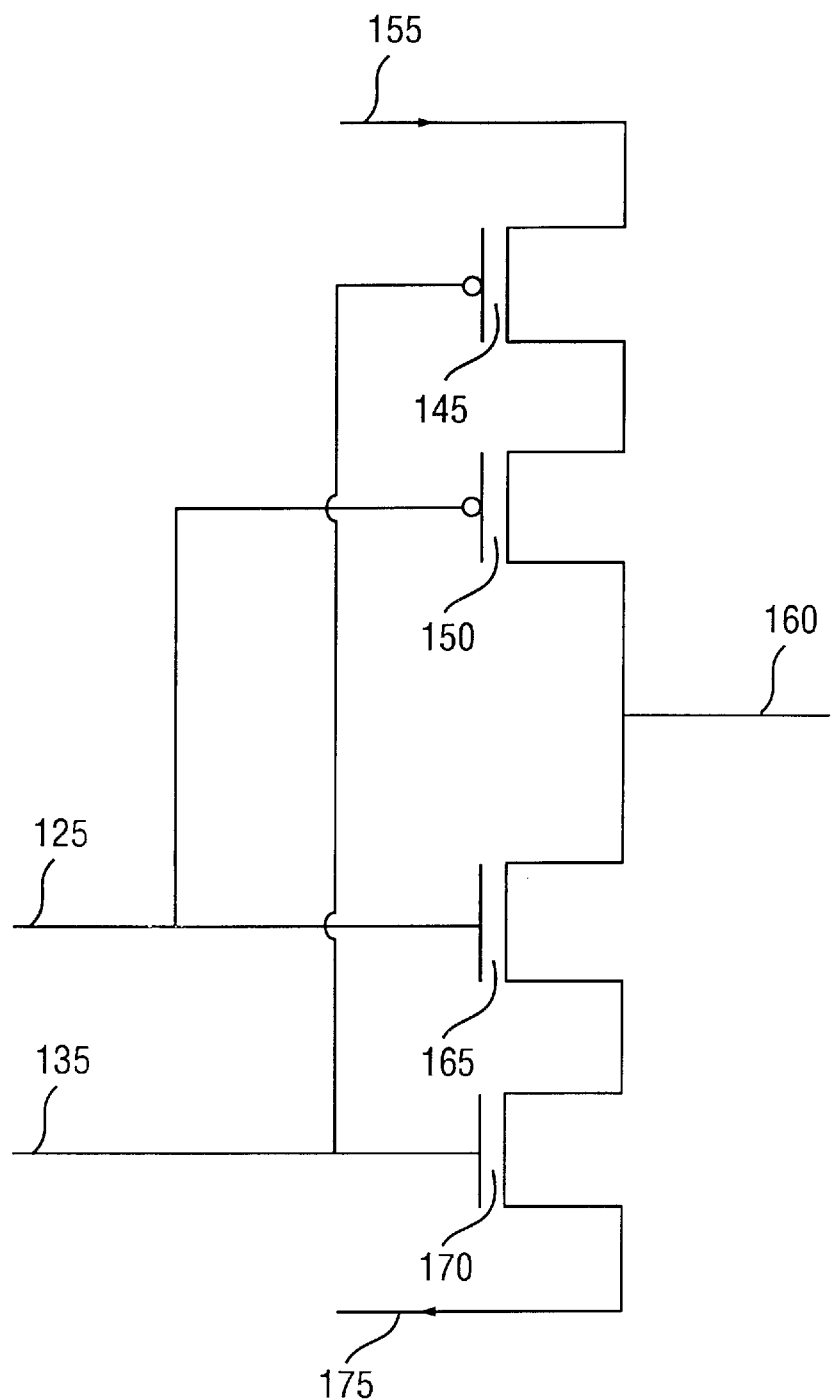
FIG. 3 is a circuit diagram of an embodiment of a phase-and-frequency detector.

One embodiment of the phase-and-frequency detector 140 is shown in FIG. 3. Referring to that Figure, the phase-and-frequency detector 140 contains two conventional negative-truth switches 145 and 150. In one embodiment, the negative-truth switches 145 and 150 are p-channel transistors. The first negative-truth switch 145 is controlled by the state of the half-cycle-delayed output 135. The second negative-truth switch 150 is controlled by the state of the latched output 125. The two negative-truth switches 145 and 150 are connected in series between a current source 155 and a phase error signal 160.

The phase-and-frequency detector 140 also contains two conventional affirmative-truth switches 165 and 170. In one embodiment, the affirmative-truth switches 165 and 170 are n-channel transistors. The first affirmative-truth switch 165 is controlled by the state of the latched output 125. The second affirmative-truth switch 170 is controlled by the state of the half-cycle-delayed output 135. The two affirmative-truth switches 165 and 170 are connected in series between the phase error signal 160 and a current sink 175.

Figure 4:
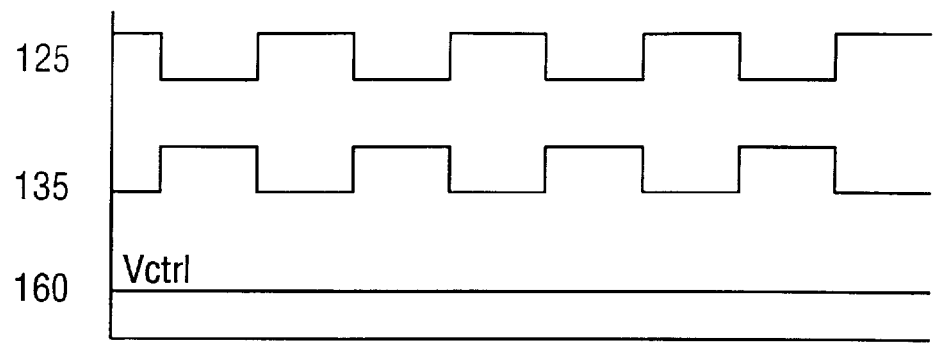
FIG. 4 is a timing diagram of various signals of the phase-and-frequency detector of FIG. 3.

As shown in FIG. 4, the phase-and-frequency detector 140 generates a phase error signal 160 whenever the latched output 125 and the half-cycle-delayed output 135 are not mutually exclusive. Thus, when one signal is TRUE and the other is FALSE the phase error signal 160 is zero. However, when both the latched output 125 and the half-cycle-delayed output 135 are TRUE, the phase error signal 160 is TRUE. Similarly, when both the latched output 125 and the half-cycle-delayed output 135 are FALSE, the phase error signal 160 is TRUE.

4.4. The Low Pass Filter

Referring again to FIG. 1, the phase error signal 160 is fed to a low pass filter 180. This low pass filter 180 integrates the phase error signal 160. In one embodiment, the low pass filter 180 is a conventional capacitor. In another embodiment, the low pass filter 180 is the circuit as shown in FIG. 5.

Figure 5:
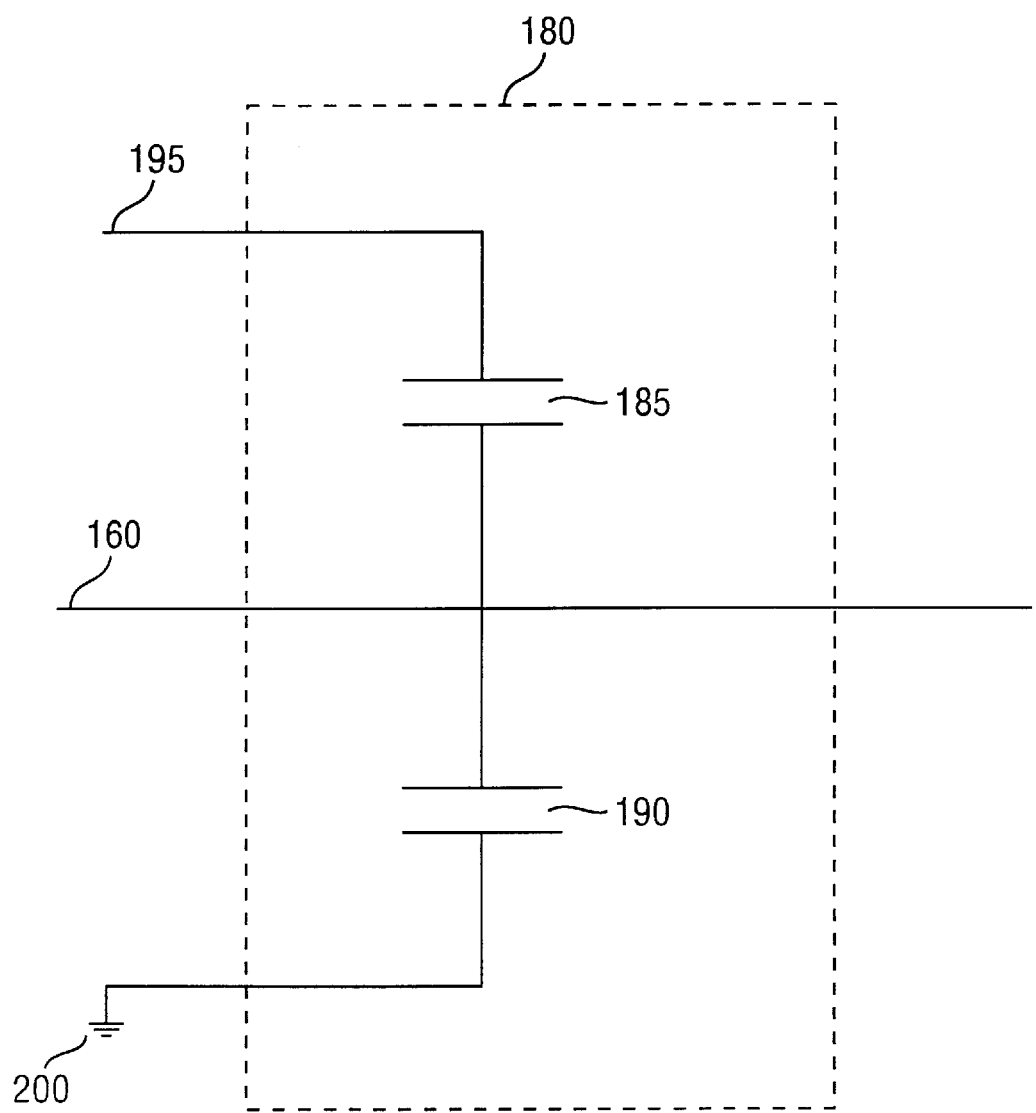
FIG. 5 is a diagram of an embodiment of one embodiment of a low pass filter.

Referring to FIG. 5, the low pass filter 180 includes a first capacitor 185 and a second capacitor 190. The first capacitor 185 is connected between a voltage source 195 and the phase error signal 160. The second capacitor 190 is connected between the phase error signal 160 and ground 200. By properly selecting the values of the first capacitor 185 and the second capacitor 190 it is possible to initially set the delay of the VCDL 130 to a near optimum value. By initially setting the delay of the VCDL 130, the clock lock time may be reduced.

For a particular VCDL 130, a given voltage signal will result in a given delay. Therefore, when the voltage signal is known, selection of the capacitance values for the first capacitor 185 and the second capacitor 190 can be determined by the following formula:

$$V = V_{source} * C_1/(C_1+C_2)$$

where

V=Desired VCDL 130 control voltage,
$V_{source}$=Voltage of the voltage source 195,
$C_1$=Capacitance of the first capacitor 185, and
$C_2$=Capacitance of the second capacitor 190.

4.5. Active Control of the Voltage Control Delay Line

The integrated phase error signal 205, which is an analog voltage signal, is fed to a conventional VCDL 130. The integrated phase error signal 205 controls the delay through the VCDL 130. Thus, the integrated phase error signal 205 ensures that the VCDL 130 delays the latched output 125 by 180 degrees.

4.6. Generation of the High Frequency Clock Signal

The VCDL replicates the latched output 125 into a plurality of component signals 210. The first component signal 215 is delayed from the latched output 125 by (1/N) cycles, where N is the number of component signals. The second component signal 220 is delayed from the latched output 125 by (2/N) cycles. Similarly, each Jth component signal is delayed from a (J–1)th component signal by 1/N cycles.

Figure 6:
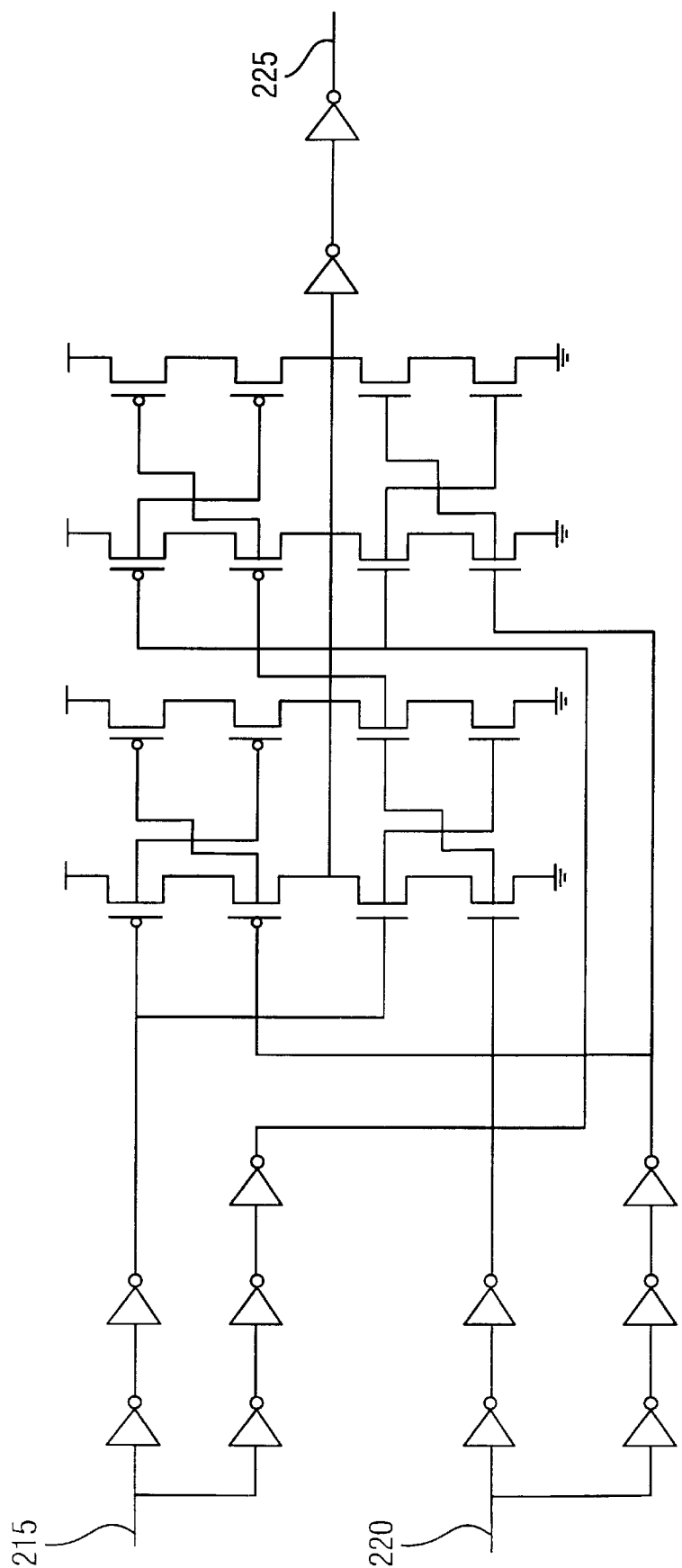
FIG. 6 is a circuit diagram of one embodiment of an XOR gate.

As shown in FIG. 2, the plurality of component signals 210 are logically combined to generate a high speed clock signal 225. In one embodiment, the plurality of component signals 210 are combined using the exclusive-OR (XOR) operation. This XOR operation may be implemented by a conventional XOR gate. Alternatively, the XOR operation may be implemented by the circuit shown in FIG. 6. This circuit has near identical delays from each of the two inputs 215 & 220 to the high speed clock signal 225. In addition, the rise time of the circuit is nearly identical to the fall time. By equalizing the delays and equalizing the rise and fall times, tighter control of the high speed clock signal 225 may be obtained.

5. SOME ADVANTAGES OF THE INVENTION

In the field of integrated circuits, it is often convenient to multiply a clock signal from one frequency to a higher frequency. For example, instead of utilizing an expensive 100 Mhz crystal, a designer can utilize a 25 Mhz crystal and multiply its frequency by a factor of four. When attempting to multiply a clock signal, it is often desirable to minimize die area, power dissipation, clock lock time, and phase jitter while maximizing power supply noise rejection and circuit robustness.

An advantage of the invention is that it allows multiplication of a clock by any factor greater than 1. While this factor is often an integer, it can also be a real number greater than 1.0. Another advantage of the invention is that it minimizes clock lock time, die area, and power dissipation. Still another advantage of the invention is that it maximizes power supply noise rejection.

While the invention has been described in conjunction with specific embodiments thereof, it will be apparent to those of ordinary skill having the benefit of this disclosure that other modifications and changes therein in addition to the examples discussed above may be made by those skilled in the art without departing from the spirit and scope of the invention.

We claim:

1. A clock signal frequency multiplier comprising:
 (a) a first edge detector configured to receive a clock-in signal and to generate an output;
 (b) a set-reset latch configured (1) to receive the output of the first edge detector as a set signal, and (2) to generate a latched output;
 (c) a voltage control delay line (VCDL) circuit configured to receive the latched output and to generate a half-cycle-delayed output;
 (d) a second edge detector configured to receive the half-cycle-delayed output and to generate an output;
 (e) said set-reset latch being configured to also receive the output from the second edge detector as a reset signal;
 (f) a phase-and-frequency detector configured (1) to receive the latched output and the half-cycle-delayed output, and (2) to generate phase error signal;
 (g) a low pass filter receiving said phase error signal and outputting an integrated phase error output;
 (h) said VCDL circuit coupled to receive said integrated phase error output as a voltage delay control;
 (i) said VCDL circuit configured to output a plurality of taps; and
 (j) said plurality of taps logically combined to form a high speed clock.

2. A method of multiplying the speed of a clock signal of an integrated circuit (IC) by a factor N to generate a times-N clock signal, the steps of the method comprising:
 (a) receiving the clock signal;
 (b) generating a latched output signal in response to the clock signal;
 (c) generating a half cycle delayed output signal upon receiving the latched output signal;
 (d) resetting the latched output signal with the half cycle delayed output signal;
 (e) generating a phase error signal representative of the phase error between the latched output signal and the half cycle delayed output signal;
 (f) controlling a delay in a variable delay circuit with the phase error signal; and
 (g) generating said times-N clock signal from the outputs of the variable delay circuit.

3. Apparatus for multiplying the speed of a clock signal of an integrated circuit (IC) by a factor N to generate a times-N clock signal, comprising:
 (a) means for receiving said clock signal;
 (b) a set-reset latch generating a latched output signal in response to an output of said means for receiving said clock signal;

(c) means for generating a half cycle delayed output signal in response to receiving said latched output signal, said half cycle delayed signal resetting said set-reset latch;

(d) a phase and frequency detector receiving the latched output signal and the half cycle delayed signal and generating a phase error signal;

(e) a voltage controlled variable delay circuit receiving the phase error signal and adjusting its signal delays in response thereto; and (f) means for generating said times-N clock signal from the combination of the signals from the voltage controlled variable delay circuit.

4. The apparatus of claim 3, wherein said phase and frequency detector comprises:

(a) two switches in series between a current source and the phase error signal, the switches comprising:

(1) a first negative-truth switch controlled by the state of the half cycle delayed output signal; and (2) a second negative-truth switch controlled by the state of the latched output signal;

(b) two switches in series between said phase error signal and a current sink, the switches comprising:

(1) a first affirmative-truth switch controlled by the state of the latched output signal; and (2) a second affirmative-truth switch controlled by the state of the half cycle delayed output signal.

5. The phase and frequency detector of claim 4, wherein each said negative-truth switch comprises a p-channel transistor.

6. The phase and frequency detector of claim 5, wherein each said affirmative-truth switch comprises an n-channel transistor.

* * * * *